(12) United States Patent
Wang

(10) Patent No.: US 8,953,319 B2
(45) Date of Patent: Feb. 10, 2015

(54) HEAT-DISSIPATING MODULE

(75) Inventor: Cheng-Yu Wang, Taipei (TW)

(73) Assignee: Asustek Computer Inc., Taipei (TW)

( * ) Notice: Subject to any disclaimer, the term of this patent is extended or adjusted under 35 U.S.C. 154(b) by 239 days.

(21) Appl. No.: 13/562,636

(22) Filed: Jul. 31, 2012

(65) Prior Publication Data

US 2013/0039011 A1 Feb. 14, 2013

Related U.S. Application Data

(60) Provisional application No. 61/521,612, filed on Aug. 9, 2011.

(51) Int. Cl.
*H05K 7/20* (2006.01)
*H01L 23/36* (2006.01)
*H01L 23/40* (2006.01)
*H01L 23/427* (2006.01)

(52) U.S. Cl.
CPC ............ *H01L 23/36* (2013.01); *H01L 23/4006* (2013.01); *H01L 23/427* (2013.01)
USPC ........... 361/700; 361/689; 361/699; 361/704; 361/711; 165/80.4; 257/714; 257/715

(58) Field of Classification Search
None
See application file for complete search history.

(56) References Cited

U.S. PATENT DOCUMENTS

| 5,504,652 | A  | * | 4/1996 | Foster et al. | 361/704 |
|---|---|---|---|---|---|
| 6,700,782 | B1 | * | 3/2004 | Bopp et al. | 361/704 |
| 7,072,184 | B2 | * | 7/2006 | Kalyandurg | 361/704 |
| 7,095,614 | B2 | * | 8/2006 | Goldmann | 361/704 |
| 7,170,750 | B2 | * | 1/2007 | Tanaka | 361/719 |
| 7,414,850 | B2 | * | 8/2008 | Hung | 361/719 |
| 7,589,972 | B2 | * | 9/2009 | Ma et al. | 361/719 |
| 7,606,036 | B2 | * | 10/2009 | Hwang et al. | 361/719 |
| 7,641,505 | B2 | * | 1/2010 | Ma | 439/485 |
| 7,643,103 | B2 |   | 1/2010 | Pan et al. |  |
| 7,697,298 | B2 | * | 4/2010 | Chen | 361/719 |
| 8,295,042 | B2 | * | 10/2012 | Cheng et al. | 361/679.52 |
| 8,593,813 | B2 | * | 11/2013 | Wertz | 361/719 |
| 2003/0102108 | A1 | * | 6/2003 | Sarraf et al. | 165/80.3 |

FOREIGN PATENT DOCUMENTS

| CN | 200610162244 | 6/2008 |
|---|---|---|
| TW | 200412487 A | 7/2004 |
| TW | M281391 U | 11/2005 |
| TW | M369486 U1 | 11/2009 |
| TW | 201010587 A | 3/2010 |
| TW | M383766 U1 | 7/2010 |
| TW | M399581 U1 | 3/2011 |

* cited by examiner

*Primary Examiner* — Boris Chervinsky
(74) *Attorney, Agent, or Firm* — Muncy, Geissler, Olds & Lowe, P.C.

(57) ABSTRACT

A heat-dissipating module applied to a circuit board having an electronic element is disclosed. The heat-dissipating module includes a plurality of connecting portions, a contacting portion and a folded portion. The heat-dissipating module is connected to the circuit board by the connecting portions, and a first surface of the contacting portion contacts the electronic element. The folded portion is connected to the contacting portion. The heat-dissipating module is suitable for a thin and light electronic device and has firm structure.

10 Claims, 5 Drawing Sheets

HEAT-DISSIPATING MODULE

CROSS REFERENCE TO RELATED APPLICATIONS

The non-provisional patent application claims priority to U.S. provisional patent application with Ser. No. 61/521,612 filed on Aug. 9, 2011. This and all other extrinsic materials discussed herein are incorporated by reference in their entirety.

BACKGROUND OF THE INVENTION

1. Field of Invention

The present disclosure relates to a heat-dissipating module and, in particular, to a heat-dissipating module applied to a circuit board.

2. Related Art

Since the trend of consuming products is toward thinner, the requirements to the heights or thicknesses of various components (e.g. the components on the circuit board) become more and more critical. The smaller heights or thicknesses of the components can fabricate the thinner electronic devices.

FIG. 1 is a schematic diagram showing a conventional heat-dissipating module 1 applied to a circuit board. The heat-dissipating module 1 comprises a conductive element 11, two fixing elements 12 and a heat pipe 13. The conductive element 11 contacts the electronic component on the circuit board, such as a CPU. The fixing elements 12 are connected to the conductive element 11 and screwed on the circuit board. The heat pipe 13 is disposed on the conductive element 11 for bringing the heat generated by the electronic component away.

Since the fixing elements 12 and the conductive element 11 are connected to each other, a stacked height H thereof is existed. This stacked height H prohibits the application of the heat-dissipating module 1 on the thin or ultra-thin electronic devices. Furthermore, when a component becomes thinner, the structural strength thereof is definitely weaker.

SUMMARY OF THE INVENTION

The present disclosure provides a heat-dissipating module that is thin and still has improved structural strength, so that it can be applied to thin products.

A heat-dissipating module is applied to a circuit board having an electronic element. The heat-dissipating module includes a plurality of connecting portions, a contacting portion, a folded portion and a heat pipe. The heat-dissipating module is connected to the circuit board by the connecting portions. A first surface of the contacting portion is contacted with the electronic element. The folded portion is connected to the contacting portion. The heat pipe is disposed on a second surface of the contacting portion.

These and other features, aspects and advantages of the present invention will become better understood with regard to the following description, appended claims, and accompanying drawings.

DETAILED DESCRIPTION OF THE INVENTION

Figure 1:
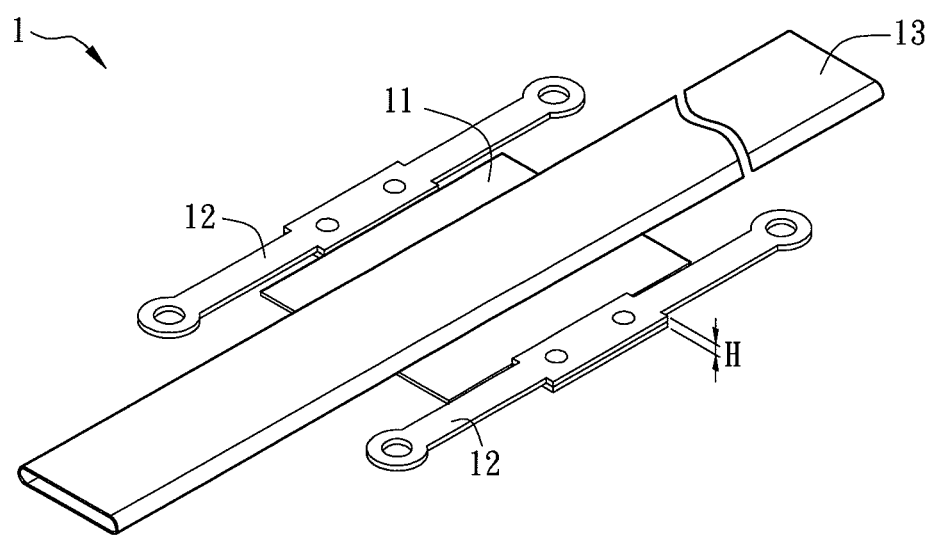
FIG. 1 is a schematic diagram showing a conventional heat-dissipating module applied to a circuit board.
Figure 2:
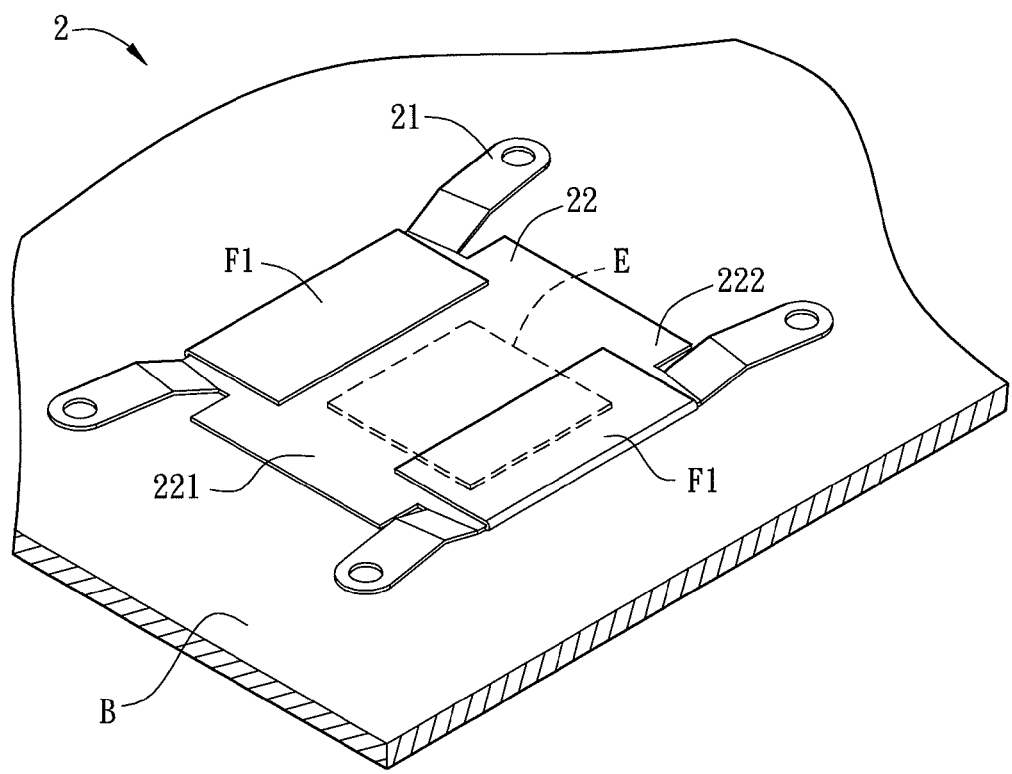
FIG. 2 is a schematic diagram showing a heat-dissipating module applied to a circuit board according to a preferred embodiment of the disclosure.

FIG. 2 is a schematic diagram showing a heat-dissipating module 2 applied to a circuit board B according to a preferred embodiment of the disclosure. The applicable electronic device of the heat-dissipating module 2 is not limited in this invention. For example, the heat-dissipating module 2 can be applied to the thin or ultra-thin electronic devices such as ultrabook, tablet PC, smart phone, or the likes. In this embodiment, the heat-dissipating module 2 is applied to an ultrabook. Referring to FIG. 2, the heat-dissipating module 2 is applied to a circuit board B. An electronic element E (e.g. a CPU) is disposed on the circuit board B.

The heat-dissipating module 2 includes a plurality of connecting portions 21, a contacting portion 22 and a folded portion F1. Herein, the heat-dissipating module 2 is connected to the circuit board B by the connecting portions 21. In various connection methods, the connecting portions 21 may have various structures. For example, the connecting portions 21 may include a screw hole for screwing or an embedded structure for embedding to the circuit board B. In this case, each of the connecting portions 21 includes a screw hole for screwing the heat-dissipating module 2 on the circuit board B. In addition, each of the connecting portions 21 is flexible, so that the connecting portion 21 can be flexibly connected to the circuit board B. In this embodiment, four connecting portions 21 are configured and extending from the four corners of the contacting portion 22. In other embodiments, the number of the connecting portions 21 is not limited to four, and each of the connecting portions 21 may has different structure.

The contacting portion 22 includes a first surface 221 and a second surface 222, which are disposed opposite to each other. The first surface 221 of the contacting portion 22 is configured to contact the electronic element E, so that the heat generated by the electronic element E can be conducted to the contacting portion 22. In addition, the connecting portion 21 has a height difference with respect to the contacting portion 22.

The folded portion F1 is connected to the contacting portion 22, and the contacting portion 22 is disposed between the folded portion F1 and the electronic element E. In this embodiment, two folded portions F1 are configured to connect with two edges of the contacting portion 22. The proper design of the folded portion F1 can further improve the structural strength of the heat-dissipating module 2 and increase the heat conduction area.

In this embodiment, the connecting portions 21, the contacting portion 22 and the folded portion F1 are integrally formed as one piece. The heat-dissipating module 2 is made of thermo-conductive materials such as copper, aluminum, beryllium copper or the likes.

The heat-dissipating module 2 of this embodiment may have various types, which will be described herein below.

Figure 3:
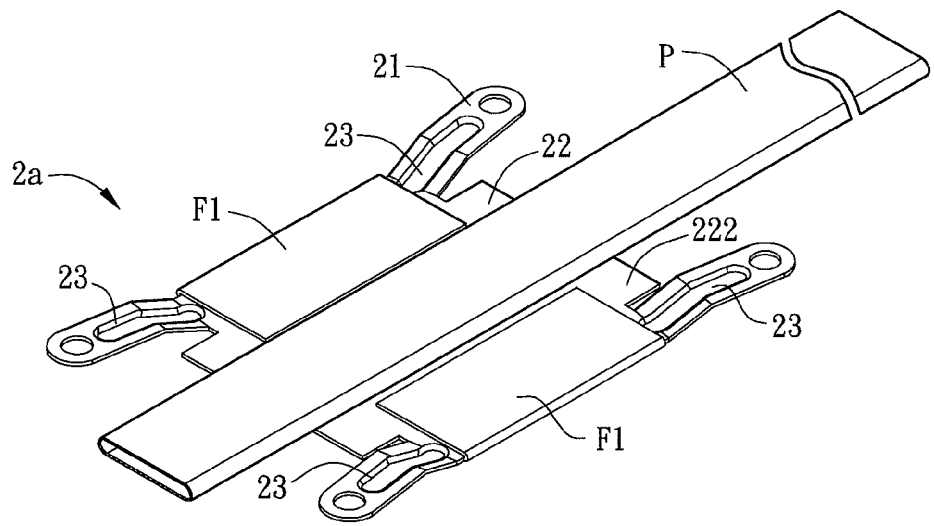
FIGS. 3 to 7 are schematic diagrams showing different aspects of the heat-dissipating module according to the preferred embodiment of the disclosure.

With reference to FIG. 3, a heat-dissipating module 2a includes a plurality of connecting portions 21, a contacting portion 22, a heat pipe P and at least a three-dimensional (3D) structure 23. The 3D structure 23 is disposed between the connecting portions 21 and the contacting portion 22. In this embodiment, four 3D structures 23 are configured and extending from the contacting portion 22 to the connecting portions 21, respectively. The 3D structures 23 can be in any shape such as recesses or protrusions. The proper design of the 3D structure 23 can improve the structural strength of the heat-dissipating module 2a, thereby increasing the product reliability and preventing the undesired elasticity fatigue.

In addition, the heat pipe P is disposed on the second surface 222 of the contacting portion 22. The heat generated by the electronic element E is transferred to the heat pipe P through the contacting portion 22, and then the heat pipe P can bring the heat transferred from the contacting portion 22 away. In more details, a fluid is filled in the heat pipe P for bringing the heat away by heat exchange. The folded portion F1 is disposed adjacent to the heat pipe P, and the height of the folded portion F1 is not larger than that of the heat pipe P.

Figure 4:
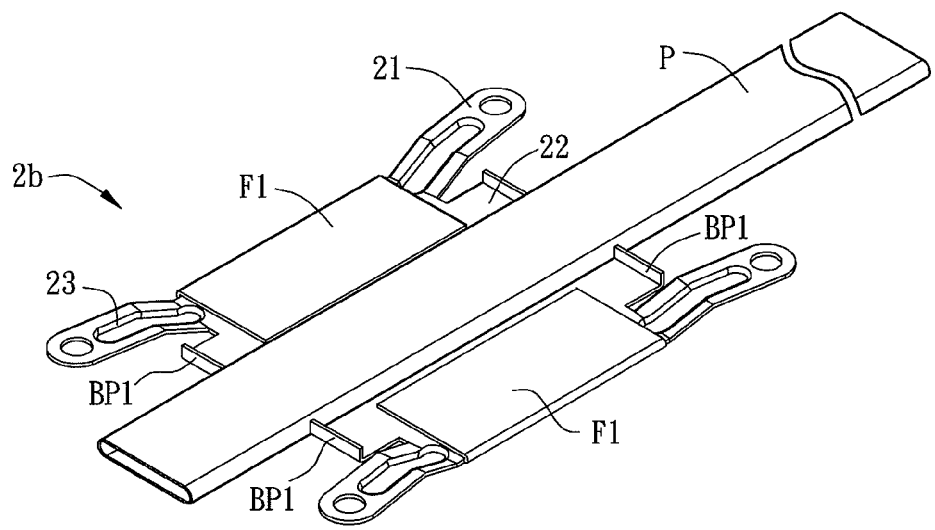

With reference to FIG. 4, a heat-dissipating module 2b includes a plurality of connecting portions 21, a contacting portion 22, and a heat pipe P. At least one edge of the contacting portion 22 of the heat-dissipating module 2b is configured with a bent portion BP1. In this embodiment, two edges of the contacting portion 22 of the heat-dissipating module 2b are configured with a bent portion BP1, respectively. The proper design of the bent portion BP1 can improve the structural strength of the heat-dissipating module 2b and increase the heat conductive area.

Figure 5:
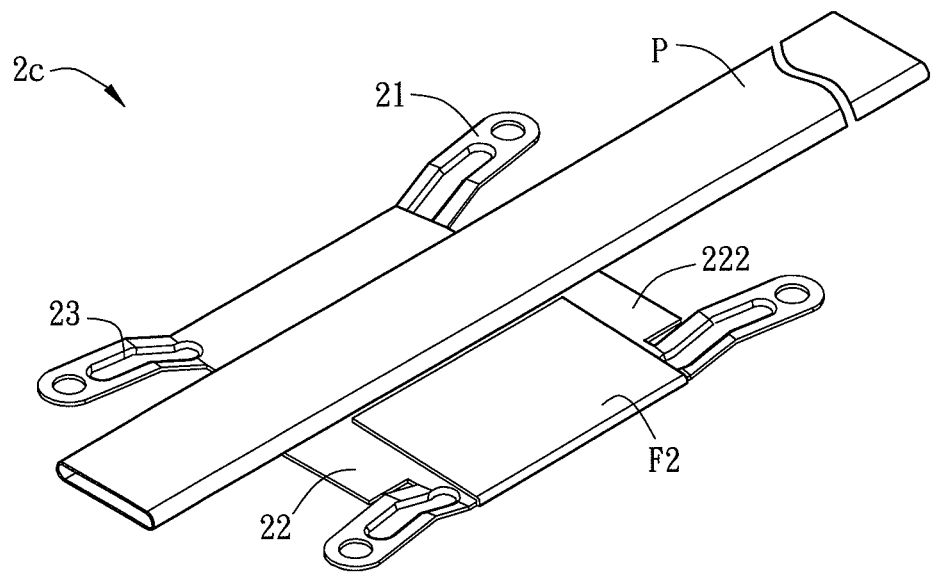

As shown in FIG. 4, the heat pipe P is located at the center of the contacting portion 22. Of course, in other embodiments, the heat pipe P may be disposed at any position of the contacting portion 22 rather than the center position thereof. In addition, the heat pipe P of the heat-dissipating module 2c as shown in FIG. 5 is located at one end of the contacting portion 22, and the heat-dissipating module 2c has only one folded portion F2.

Figure 6:
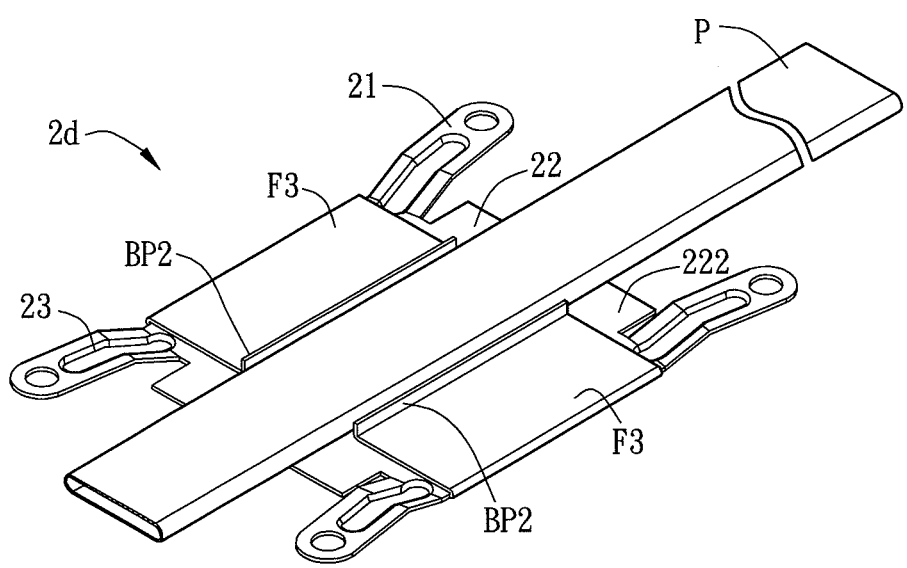

With reference to FIG. 6, a heat-dissipating module 2d includes a plurality of connecting portions 21, a contacting portion 22, a heat pipe P, and a bent portion BP2. An edge of the folded portion F3 of the heat-dissipating module 2d is configured with a bent portion BP2. In this case, the bent portion BP2 is disposed adjacent to the heat pipe P. The proper design of the bent portion BP2 can improve the structural strength of the heat-dissipating module 2d and increase the heat conductive area.

Figure 7:
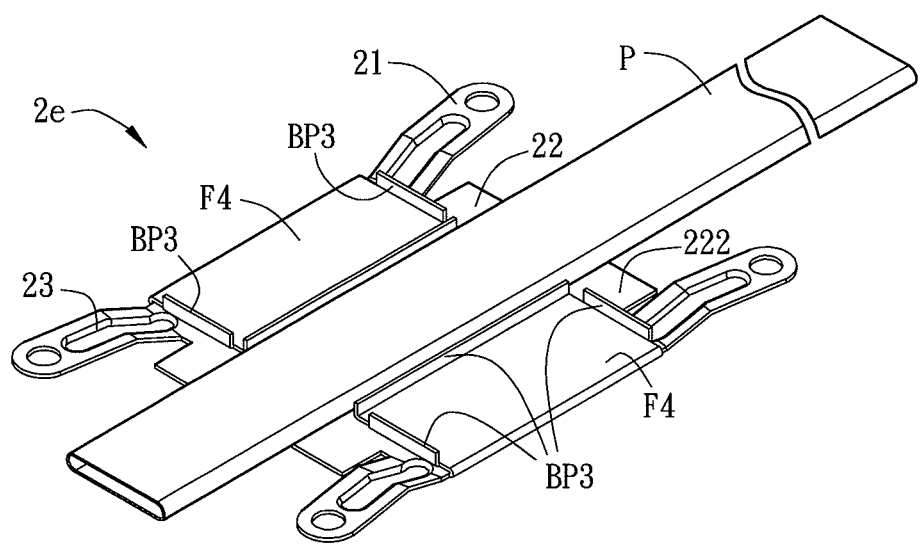

With reference to FIG. 7, a heat-dissipating module 2e includes a plurality of connecting portions 21, a contacting portion 22, and a heat pipe P. Each of edges of the folded portion F4 of the heat-dissipating module 2e is configured with a bent portion BP3. The proper design of the bent portions BP3 can improve the structural strength of the heat-dissipating module 2e and increase the heat conductive area.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A heat-dissipating module applied to a circuit board, the circuit board having an electronic element, the heat-dissipating module comprising:
    a plurality of connecting portions, the heat-dissipating module being connected to the circuit board by the connecting portions;
    a contacting portion, a first surface of the contacting portion contacting the electronic element; and
    a folded portion connected to the contacting portion and covered above the contacting portion.

2. The heat-dissipating module of claim 1, wherein the connecting portions, the contacting portion and the folded portion are integrally formed.

3. The heat-dissipating module of claim 1, wherein the contacting portion is disposed between the folded portion and the electronic element.

4. The heat-dissipating module of claim 1, wherein at least one edge of the folded portion has a bent part.

5. The heat-dissipating module of claim 1, wherein each of the connecting portions comprises a screw hole.

6. The heat-dissipating module of claim 1, wherein each of the connecting portions is flexible.

7. The heat-dissipating module of claim 1, wherein each of the connecting portions has a height difference with respect to the contacting portion.

8. The heat-dissipating module of claim 1, wherein at least one edge of the contacting portion has a bent part.

9. The heat-dissipating module of claim 1, further comprising:
    at least a three-dimensional structure disposed between the contacting portion and each of the connecting portions.

10. A heat-dissipating module applied to a circuit board, the circuit board having an electronic element, the heat-dissipating module comprising:
    a plurality of connecting portions, wherein the heat-dissipating module is connected to the circuit board by the connecting portions;
    a contacting portion, wherein a first surface of the contacting portion contacts the electronic element;
    a folded portion connected to the contacting portion and covered above the contacting portion; and
    a heat pipe disposed on a second surface of the contact portion.

* * * * *